(12) United States Patent
Ishizaki

(10) Patent No.: US 8,156,088 B2
(45) Date of Patent: Apr. 10, 2012

(54) DOCUMENT ENCODING APPARATUS, DOCUMENT ENCODING METHOD, AND COMPUTER-READABLE STORAGE MEDIUM

(75) Inventor: Tooru Ishizaki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 860 days.

(21) Appl. No.: 12/211,423

(22) Filed: Sep. 16, 2008

(65) Prior Publication Data

US 2009/0083298 A1    Mar. 26, 2009

(30) Foreign Application Priority Data

Sep. 20, 2007 (JP) ................................ 2007-244449
Sep. 3, 2008 (JP) ................................ 2008-226380

(51) Int. Cl.
*G06F 7/00* (2006.01)
*G06F 7/38* (2006.01)

(52) U.S. Cl. ....................... 707/693; 708/495; 708/542

(58) Field of Classification Search .................... 707/693
See application file for complete search history.

(56) References Cited

U.S. PATENT DOCUMENTS

| | | | | |
|---|---|---|---|---|
| 3,626,167 A | * | 12/1971 | Guck et al. | 341/82 |
| 5,778,152 A | * | 7/1998 | Oki et al. | 706/25 |
| 6,292,802 B1 | * | 9/2001 | Kessenich et al. | 1/1 |
| 6,904,562 B1 | * | 6/2005 | Hind et al. | 715/239 |
| 7,136,891 B2 | * | 11/2006 | Bera | 708/490 |
| 7,669,183 B2 | * | 2/2010 | Bowman et al. | 717/113 |
| 2006/0005127 A1 | * | 1/2006 | Ferguson et al. | 715/522 |
| 2007/0208792 A1 | * | 9/2007 | Berjon et al. | 708/207 |

FOREIGN PATENT DOCUMENTS

| | | |
|---|---|---|
| JP | 03-055919 | 3/1999 |
| JP | 2005-215950 | 8/2005 |
| WO | 2006/000548 A1 | 1/2006 |

OTHER PUBLICATIONS

Cowlishaw, M., "Decimal Floating-Point: Algorism [sic] for Computers", Proceedings of the 16th IEEE Symposium on Computer Arithmetic, Jun. 15-18, 2003, pp. 104-111.
Ghido, F., "An Efficient Algorithm for Lossless Compression of IEEE Float Audio", Proceedings of the Data Compression Conference, Mar. 23-25, 2004, pp. 429-438.
Liefke, H., et al., "XMill: An Efficient Compressor for XML Data", Sigmod Record, NY, NY, vol. 29, No. 2, Jun. 1, 2000, pp. 153-164.
Ratanaworabhan, P., et al., "Fast Lossless Compression of Scientific Floating-Point Data", Proceedings of the Data Compression Conference, 2006, p. 133-142.

* cited by examiner

*Primary Examiner* — Robert Timblin
(74) *Attorney, Agent, or Firm* — Fitzpatrick, Cella, Harper & Scinto

(57) ABSTRACT

Digit counts c' after the decimal point of attribute values in a structured document are acquired (S404). The detected attribute values are transformed into value character strings that represent integer values by manipulating the decimal point positions of the attribute values in accordance with a maximum digit count of the acquired digit counts (S406). The transformed value character strings and the maximum digit count C are encoded (S407).

6 Claims, 10 Drawing Sheets

EXAMPLE) 0.01

IN CASE OF VALUE CHARACTER 0.01

4 BYTES

IN CASE OF IEEE754

0x3c  0x23  0xd7  0x0a

4 BYTES

SIGN (1 BIT)   EXPONENT PART (8 BITS)   MANTISSA PART (23 BITS)

```
<svg>
<g>
<animateTransform
    values="-68 , -418 ; -101.49 , -446.71 ; -126.52 , -465.24 ; -139.49 ,
-469.29 ; -139.8 , -458.14 ..."
    keyTimes="0 ; 0.01 ; 0.02 ; 0.1 ; ..."
    dur="4s"
/>
<path
    d="M 198.784 , 59.762 c 3.183 , -0.911 , -2.825 , 5.366 , -5.742 , ... ; 1"
/>
</g>
</svg>
```

| DATA TYPE | CODE | |
|---|---|---|
| short 2-BYTE INTEGER | 0x18 | EXISTING DEFINITION |
| int 4-BYTE INTEGER | 0x19 | |
| float | 0x1a | |
| double | 0x1b | |
| 1-BYTE INTEGER X$10^1$ | 0x31 | ADD FOR INTEGER ENCODING |
| 1-BYTE INTEGER X$10^2$ | 0x32 | |
| 1-BYTE INTEGER X$10^3$ | 0x33 | |
| 2-BYTE INTEGER X$10^1$ | 0x41 | |
| 2-BYTE INTEGER X$10^2$ | 0x42 | |
| 2-BYTE INTEGER X$10^3$ | 0x43 | |

SOURCE SVG

```
<svg>
  <g>
    <path
      d="M 198.784 , 59.762 c 3.813 , −0.911 , −2.825 , 5.366 , −5.742 , ... "
    />
  </g>
</svg>
```

SVG TRANSFORMED TO ALLOW EASY ENCODING

EXAMPLE 1

```
<svg>
  <g transform="scale(0.001)">
    <path
      d="M 198784 , 59762 c 3183 , −911 , −2825 , 5366 , −5742 , ... "
    />
  </g>
</svg>
```

EXAMPLE 2

```
<svg>
  <g>
    <path
      d="M 198784 , 59762 c 3183 , −911 , −2825 , 5366 , −5742 , ... "
      transform="scale(0.001)"
    />
  </g>
</svg>
```

FIG. 9

| | DIRECT ENCODE | CALCULATE RELATIVE VALUE AND THEN ENCODE |
|---|---|---|
| 2-BYTE INTEGER $\times 10^1$ | 0×41 | 0×c1 |
| 2-BYTE INTEGER $\times 10^2$ | 0×42 | 0×c2 |
| 2-BYTE INTEGER $\times 10^3$ | 0×43 | 0×c3 |

FOR RELATIVE VALUE,
START FIRST BIT IS SET TO BE "1"

DOCUMENT ENCODING APPARATUS, DOCUMENT ENCODING METHOD, AND COMPUTER-READABLE STORAGE MEDIUM

BACKGROUND OF THE INVENTION

1. Field of the Invention

The present invention relates to an encoding technique for a structured document.

2. Description of the Related Art

Conventionally, in the XML language specification formulated by the W3C, it is a common practice to encode data by a character encoding method such as UTF-8, UTF-16, or the like upon describing data in an XML language. When data to be described as attribute values and element contents are other than characters such as integers, decimals, and the like, if these data are encoded as characters, the size becomes larger than original data, thus requiring a longer parsing process time.

With binary XML techniques such as the Fast Infoset (ISO/IEC 24824-1) formulated by the ISO and the like, attribute values and element contents in XML data can be encoded not only as characters but also as original data types such as integers, decimals, and the like. As a result, the data size can be compressed, and the parse process time can be shortened.

Note that Japanese Patent Laid-Open No. 2005-215950 discloses a technique that attains compression by replacing character strings such as element names, attribute names, and values of XML data, which repetitively appear a plurality of number of times, by shorter byte strings.

However, the conventional techniques cannot often obtain a compression effect for data including coordinate values such as graphics, maps, drawings, and the like.

The conventional binary XML technique encodes a decimal value in an IEEE754 (IEEE Standard for Binary Floating-Point Arithmetic (ANSI/IEEE Std 754-1985)) format as the data format on a computer, so as to shorten a parse process time. Upon encoding decimals in the IEEE754 format, no compression effect can be obtained for decimals having small digit counts such as −0.1, 0.2, and the like since the encoded size requires at least 4 bytes. Hence, in case of a structured document which describes many decimals having the small digit counts like an SVG document, the parse process time can be shortened, but a high compression effect cannot be obtained.

SUMMARY OF THE INVENTION

The present invention has been made in consideration of the aforementioned problems, and has as its object to provide a technique that can improve the compression efficiency for a structured document that describes many decimals having small digit counts without imposing any heavy load on the parse process of the structured document.

According to the first aspect of the present invention, there is provided a document encoding apparatus for encoding a structured document, comprising:

a detection unit adapted to detect attribute values in a structured document;

an acquisition unit adapted to acquire digit counts after a decimal point of the attribute values detected by the detection unit;

a transformation unit adapted to transform the attribute values detected by the detection unit into value character strings that represent integer values by manipulating decimal point positions of the attribute values in accordance with a maximum digit count of the digit counts acquired by the acquisition unit; and an encoding unit adapted to encode the value character strings transformed by the transformation unit, and the maximum digit count.

According to the second aspect of the present invention, there is provided a document encoding apparatus for encoding a structured document, comprising:

a detection unit adapted to detect attribute values in a structured document;

a calculation unit adapted to calculate difference values between attribute values in turn from a head in a sort order of the attribute values detected by the detection unit;

an acquisition unit adapted to acquire digit counts after a decimal point of the difference values calculated by the calculation unit;

a transformation unit adapted to transform the difference values calculated by the calculation unit into value character strings that represent integer values by manipulating decimal point positions of the difference values in accordance with a maximum digit count of the digit counts acquired by the acquisition unit; and an encoding unit adapted to encode the value character strings transformed by the transformation unit, an attribute value at a head position in the sort order of the attribute values detected by the detection unit, and the maximum digit count, wherein the encoding unit encodes the attribute value at the head position in an IEEE754 format.

According to the third aspect of the present invention, there is provided a document encoding method executed by a document encoding apparatus for encoding a structured document, comprising:

a detection step of detecting attribute values in a structured document;

an acquisition step of acquiring digit counts after a decimal point of the attribute values detected in the detection step;

a transformation step of transforming the attribute values detected in the detection step into value character strings that represent integer values by manipulating decimal point positions of the attribute values in accordance with a maximum digit count of the digit counts acquired in the acquisition step; and an encoding step of encoding the value character strings transformed in the transformation step, and the maximum digit count.

According to the fourth aspect of the present invention, there is provided a document encoding method executed by a document encoding apparatus for encoding a structured document, comprising:

a detection step of detecting attribute values in a structured document;

a calculation step of calculating difference values between attribute values in turn from a head in a sort order of the attribute values detected in the detection step;

an acquisition step of acquiring digit counts after a decimal point of the difference values calculated in the calculation step;

a transformation step of transforming the difference values calculated in the calculation step into value character strings that represent integer values by manipulating decimal point positions of the difference values in accordance with a maximum digit count of the digit counts acquired in the acquisition step; and an encoding step of encoding the value character strings transformed in the transformation step, an attribute value at a head position in the sort order of the attribute values detected in the detection step, and the maximum digit count, wherein in the encoding step, the attribute value at the head position is encoded in an IEEE754 format.

According to the fifth aspect of the present invention, there is provided a computer-readable storage medium storing a program for making a computer execute the document encoding method.

Further features of the present invention will become apparent from the following description of exemplary embodiments with reference to the attached drawings.

BRIEF DESCRIPTION OF THE DRAWINGS

FIG. 2 is a view showing an example of an SVG document;

FIG. 6 is a view for explaining definitions of data types;

FIG. 9 is a view showing examples of attribute values of a d attribute in a path element in an SVG document.

DESCRIPTION OF THE EMBODIMENTS

Preferred embodiments of the present invention will be described in detail hereinafter with reference to the accompanying drawings. Note that these embodiments will be explained as examples of preferred arrangements of the invention described in the scope of claims, and that invention is not limited to the embodiments to be described hereinafter.

First Embodiment

Figure 1:
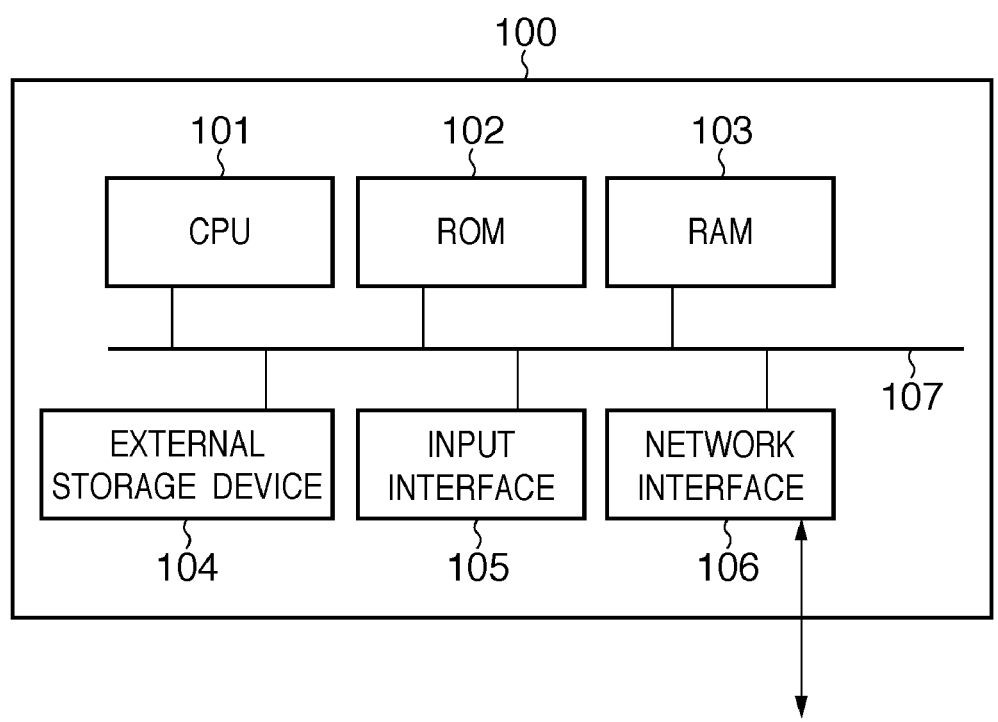
FIG. 1 is a block diagram showing an example of the hardware arrangement of a computer which is applicable to a document encoding apparatus according to the first embodiment of the present invention.

FIG. 1 is a block diagram showing an example of the hardware arrangement of a computer which is applicable to a document encoding apparatus according to this embodiment. Note that the arrangement of an apparatus applicable to the document encoding apparatus according to this embodiment is not limited to that shown in FIG. 1, and various modifications are anticipated by those who are skilled in the art. Furthermore, the present invention is not limited to the document encoding apparatus according to this embodiment, which is implemented by a single apparatus, but it may be implemented by the collaboration of a plurality of apparatuses. In this case, the plurality of apparatuses are connected via a network such as a LAN or the like.

Referring to FIG. 1, a CPU 101 controls a whole computer 100 using programs and data stored in a ROM 102 and RAM 103, and executes respective processes to be described later, which will be explained as those to be implemented by the computer 100.

The ROM 102 stores setting data and a boot program of the computer 100, data of parameters which need not be changed, and the like.

The RAM 103 has an area used to temporarily store programs and data loaded from an external storage device 104, data externally received via a network interface 106, and the like. Furthermore, the RAM 103 also has a work area used when the CPU 101 executes various processes.

The external storage device 104 is a large-capacity information storage device represented by a hard disk drive device. The external storage device 104 saves an OS (operating system), and programs and data which make the CPU 101 execute respective processes to be described later, which will be described as those to be implemented by the computer 100. The external storage device 104 saves, as files, data of structured documents to be processed (to be described later). The programs and data saved in the external storage device 104 are loaded onto the RAM 103 as needed under the control of the CPU 101, and are to be processed by the CPU 101.

An input interface 105 comprises a keyboard, mouse, and the like. When an operator of the computer 100 operates the input interface 105, he or she can input various instructions to the CPU 101.

The network interface 106 is used to connect the computer 100 to a LAN, the Internet, or the like. The computer 100 can make data communications with external devices via this network interface 106.

Reference numeral 107 denotes a bus which interconnects the aforementioned units.

Note that a storage device that can be connected to the computer 100 is not limited to the external storage device 104, and the following storage devices may be connected to the computer 100. That is, a memory card, a flexible disk (FD) or an optical disk such as a Compact Disk (CD) or the like, which is detachable from the computer 100, a magnetic or optical card, an IC card, and the like may be used.

The encoding processing of a structured document executed by the computer 100 will be described below.

In devices such as a cellular phone, digital camera, printer, and the like, which have small hardware resources, a size reduction of XML data as a structured document, and speeding-up of the parse process are demanded. Conventionally, as a technique for solving such problem, an encoding technique called binary XML is used. In binary XML, structures such as elements, attributes, and the like of XML data are encoded to binary data, and element and attribute values are encoded as original data types such as integers, decimals, and the like. Using binary data, since the data size can be reduced and the parse process can be speeded up compared to character encoding such as UTF-8, UTF-16, and the like.

However, a problem is posed in case of a structured document that describes many decimals having small digit counts like the SVG specification (the website at w3.org in the subdirectory "SVG" of subdirectory "Graphics" formulated by the W3C.

FIG. 2 is a view showing an example of an SVG document. In the SVG document shown in FIG. 2, a keyTimes attribute describes many values. These values indicate timings of an animation process, and are decimal values ranging from 0 to 1, which represent the ratios in a total time. These values are normally designated as decimals having small digit counts like "0.01", "0.02", and the like, as shown in FIG. 2, although their digit counts are not limited. In the SVG document shown in FIG. 2, a d attribute of a path element describes many real number values representing coordinate information. These real number values are normally designated as those including decimal parts with small digit counts like "3.183", "−0.911", and the like, as shown in FIG. 2, although their digit counts are not limited.

Figure 3:
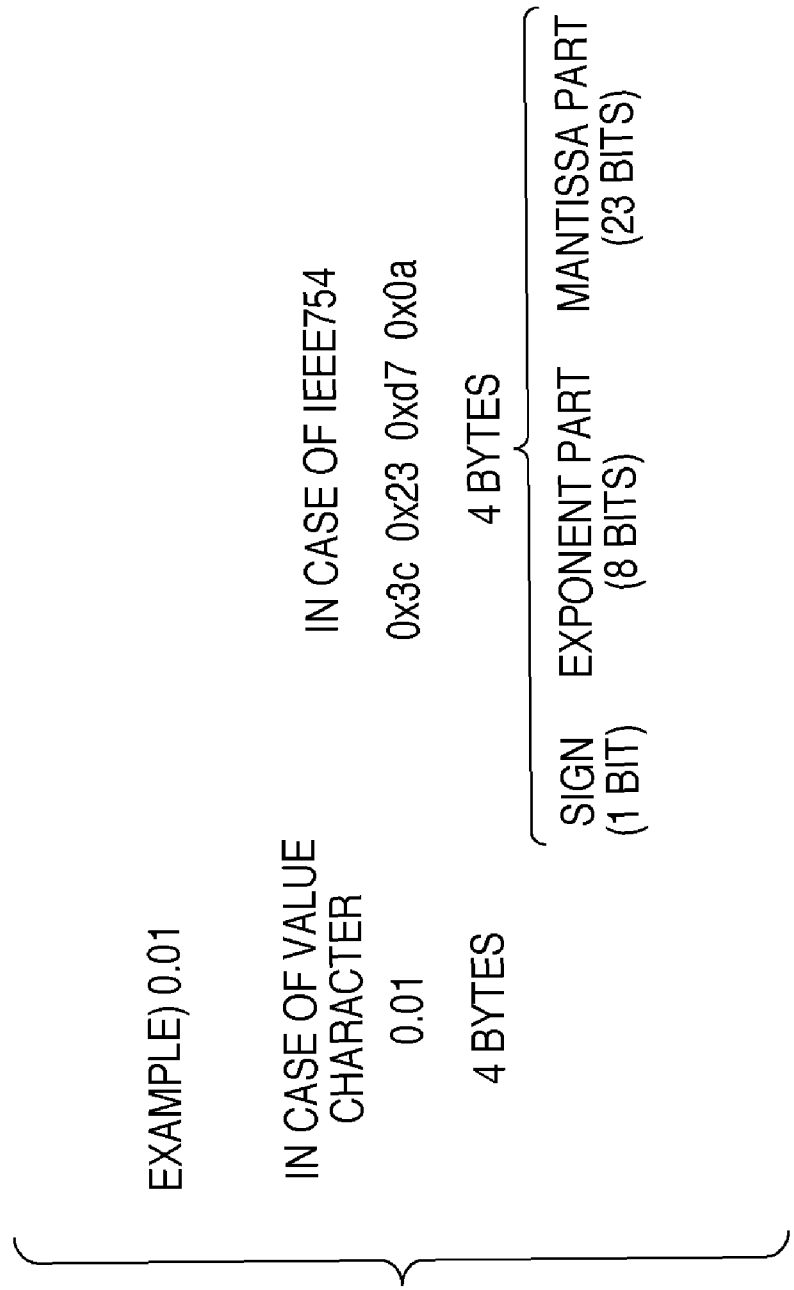
FIG. 3 is a view for explaining the IEEE754 format.

Upon applying binary XML to the SVG document shown in FIG. 2, the real number values can be encoded in the IEEE754 format. The IEEE754 format is configured by a sign, exponent part, and mantissa part, as shown in FIG. 3. At least 4 bytes are required. FIG. 3 shows an example of "0.01". However, the value character string and IEEE754 format have the same length.

The SVG document shown in FIG. 2 describes value character strings of about 3 to 6 bytes. When many such descriptions are included, if binary XML is applied, the parse process time can be shortened, but nearly no data size reduction is attained.

Figure 4:
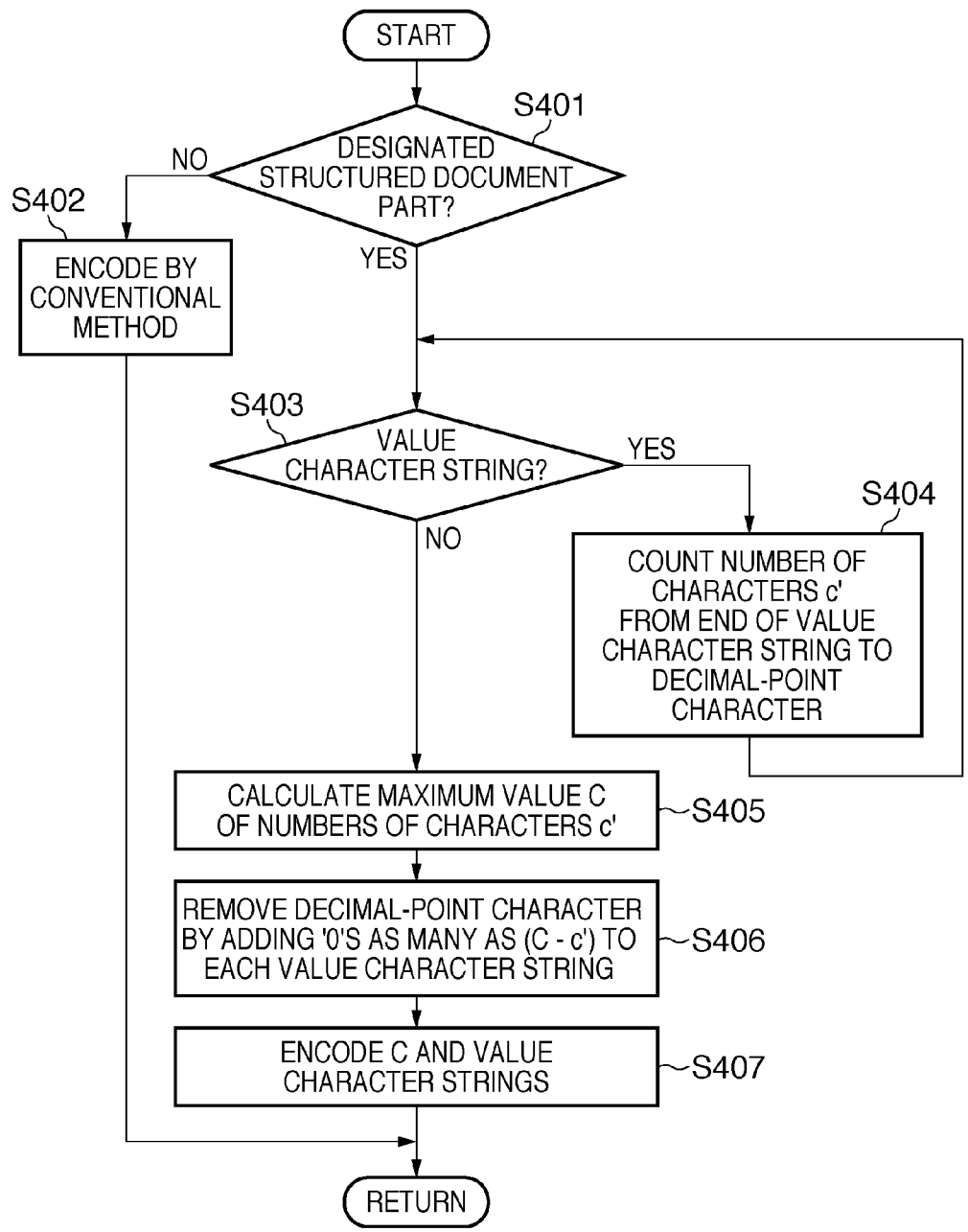
FIG. 4 is a flowchart of processing for encoding an SVG document.

FIG. 4 is a flowchart of processing for encoding an SVG document. Note that the description according to the flowchart of FIG. 4 uses the SVG document shown in FIG. 2 as an SVG example. The program and data for making the CPU 101 execute the processing according to the flowchart of FIG. 4, and data of the SVG document as a structured document are saved in the external storage device 104. Therefore, the CPU 101 loads these program and data, and the data of the SVG document onto the RAM 103, and executes the processing using the loaded program and data. In this way, the computer 100 executes the processing according to the flowchart of FIG. 4 to be described below.

Prior to execution of the processing according to the flowchart of FIG. 4, a part to be encoded is designated in advance in the data of the SVG document. If all values are to be encoded, no designation is especially required.

In this embodiment, assume that a keyTimes attribute in which decimal values with small digit counts continuously appear is designated as a part to be encoded in the data of the SVG document shown in FIG. 2. That is, a keyTimes attribute of an animateTransform element is designated. Also, a delimiter ";" of decimal values enumerated as attribute values is designated.

The CPU 101 loads the data of the SVG document shown in FIG. 2 from the external storage device 104 onto the RAM 103. Note that the method of acquiring the data of the SVG document shown in FIG. 2 onto the RAM 103 is not particularly limited.

The CPU 101 then starts processing according to the flowchart of FIG. 4.

The CPU 101 sequentially refers to data of the SVG document (structured document) input as an object to be encoded to the RAM 103, and it checks in step S401 if the referred part is the keyTimes attribute of the animateTransform element. As a result of checking, if the referred part is not the keyTimes attribute of the animateTransform element, the process advances to step S402. In step S402, the CPU 101 encodes the referred part by binary XML as is conventionally done. In the example of FIG. 2, the CPU 101 encodes the values of a d attribute by binary XML as is conventionally done.

On the other hand, as a result of checking in step S401, if the referred part is the keyTimes attribute of the animateTransform element, the process advances to step S403.

The CPU 101 checks in step S403 if all value character strings (attribute values) in the keyTimes attribute of the animateTransform element are extracted. As a result of checking, if all value character strings are extracted, the process advances to step S405; otherwise, the process advances to step S404.

In step S404, the CPU 101 extracts a value character string (attribute value) which is not extracted yet in the keyTimes attribute of the animateTransform element. The CPU 101 uses the delimiter ";", which is designated in advance, to extract the value character strings. In FIG. 2, since 0, 0.01, 0.02, 0.1, and 1 are delimited by ";", the CPU 101 extracts these value character strings. If the designated delimiter is not particularly used, the CPU 101 may sequentially check character strings of the attribute values from the head position, and may detect a proper part determined as a value character string as one value character string.

Then, the CPU 101 acquires a digit count c' after the decimal point of each extracted value character string. Note that the digit count c' can be calculated by counting the number of characters from the position of a decimal-point character "." to the end of the attribute value.

That is, when the process advances from step S403 to step S405, this means that the CPU 101 has acquired the digit counts c' after the decimal point for all value character strings (attribute values) in the keyTimes attribute of the animateTransform element.

In step S405, the CPU 101 calculates a maximum value (maximum digit count) C of the digit counts c' acquired in step S404 in association with all the value character strings (attribute values) in the keyTimes attribute of the animateTransform element.

After the value character strings are extracted, an integer encoding method of each extracted attribute value (decimal value) is determined. In order to transform a decimal value into an integer, a decimal point position must be temporarily moved (manipulated). The moved decimal point position is restored at the time of parsing. This processing becomes an overhead compared to encoding in the IEEE754 format. In this embodiment, in order to reduce such overhead, an identical integer encoding format is used in a designated structure part. If an overhead can be ignored, different integer encoding formats may be used.

Figure 5:
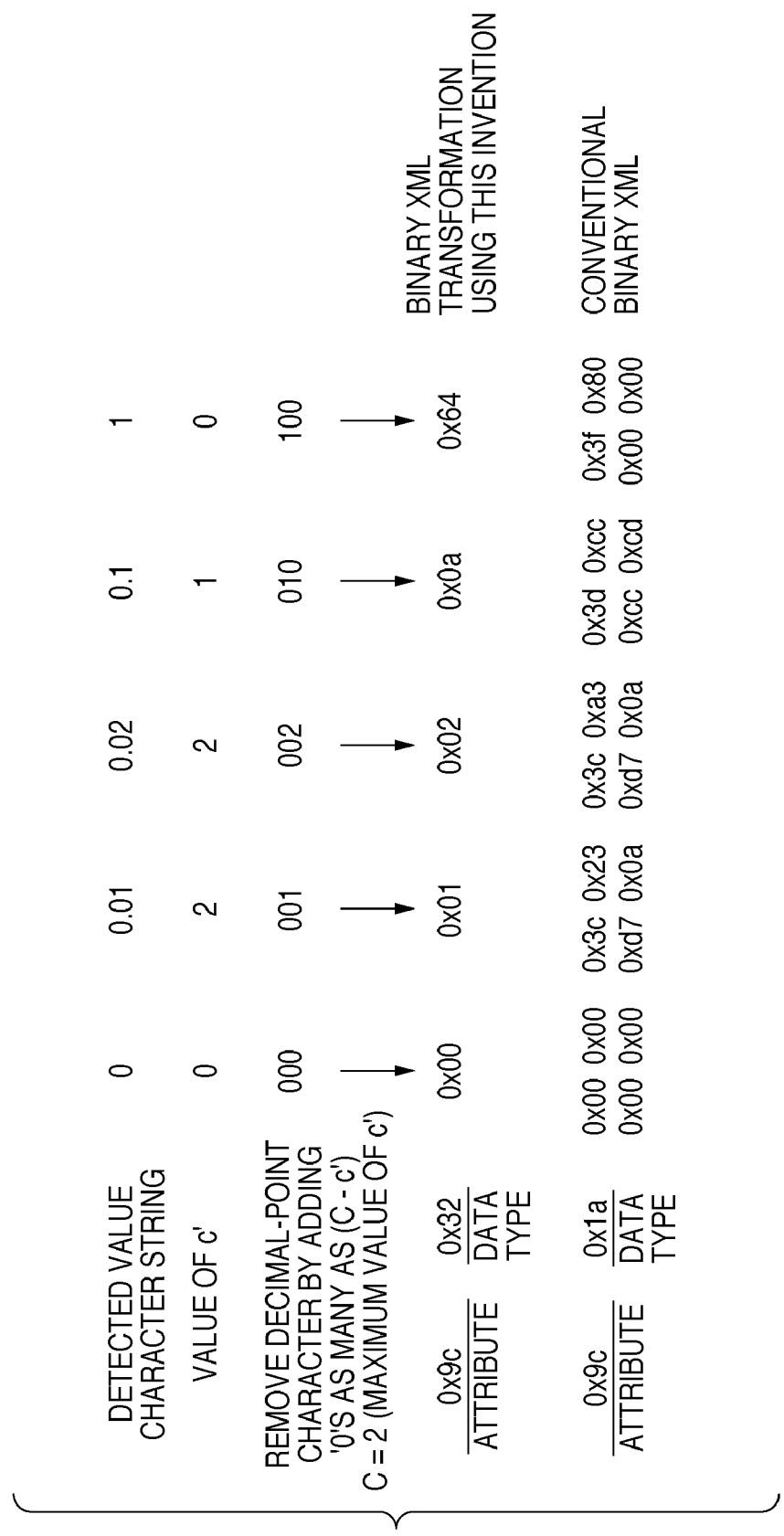
FIG. 5 is a view for explaining encoding of respective value character strings.

Note that each detected decimal value can be transformed into an integer by moving the decimal point by at least C to a lower position in decimal expression. Hence, a method of encoding an integer value obtained by multiplying a decimal value by $10^C$ is determined as a common integer encoding method to this structure part. In this embodiment, since C=2, as shown in FIG. 5, a method of encoding an integer value obtained by multiplying a decimal value by $10^2$ is determined as the common integer encoding method to this structure part. FIG. 5 is a view for explaining encoding of each value character string.

After the integer encoding method is determined, the CPU 101 encodes each detected decimal value. In order to encode each decimal value, the value character string of a decimal is temporarily transformed into the IEEE754 format, and the transformed value is multiplied by the power of 10 to be transformed into an integer. However, since temporary transformation into the IEEE754 format requires a large overhead, this embodiment implements integer encoding of a decimal value in the state of a value character string.

Therefore, in step S406, the CPU 101 generates a value character string that represents an integer value obtained by multiplying the value character string by $10^C$. In other words, this process generates a value character string that represents an integer value obtained by adding "0"s as many as a difference (C−c') between the digit count c' acquired for this value character string and the maximum digit count C to the lower position of an integer as a result of omitting the decimal point from that value character string.

By applying the process in step S406 to all value character strings, these value character strings are transformed like "0"→"000", "0.01"→"001", "0.02"→"002", "0.1"→"010", and "1"→"100", as shown in FIG. 5.

Finally, the CPU 101 encodes the value character strings generated in step S406 for all the value character strings, and the maximum digit count C in step S407. In this embodiment, these values are encoded as binary XML. Encoded values are described as a part of another data.

Conventionally, in binary XML, as shown in FIG. 5, upon encoding an attribute, a code (0x9c) indicating an attribute structure, a code indicating the data type of the attribute value, and the attribute value are described in this order. Each decimal value is encoded as a value character string or in the IEEE754 format, and the encoding method of that value is indicated by the data type.

The data type is defined, as shown in FIG. 6, and is 0x17 for a character string, 0x1a for IEEE754 single precision (float), and 0x1b for double precision (double). Hence, this embodiment expands the data type definitions, as shown in FIG. 6, to define 0x3* as a 1-byte integer, 0x31 as $10^1$, 0x32 as $10^2$, .... Since this embodiment uses $10^2$, the data type is 0x32. Using this data type, respective value character strings are encoded as binary XML. A description of the data type of the attribute values is 0x32, and the decimal values are respectively encoded to 1-byte integers like "0"→0x00, "0.01"→0x01, "0.02"→0x02, "0.1"→0x0a, and "1"→0x64. As described above, the data size of even a decimal value with a small digit count can be reduced.

In integer transformation in this case, a decimal value is defined as a fixed-point value, and encoding of the fixed decimal point position and value is included.

On the decoding side, since the data type of encoded data describes the integer encoding method, inverse transformation is executed according to the described method to acquire an original decimal value. In this embodiment, since a common integer encoding method is adopted in a structure part, inverse transformation may be executed after a series of calculation processes, thus reducing an overhead.

Second Embodiment

This embodiment will explain a case in which the encoding method described in the first embodiment is applied to a d attribute of the SVG document shown in FIG. 2. As in the keyTimes attribute, the d attribute describes many real number values including decimal parts having small digit counts. However, as shown in FIG. 2, the d attribute includes real number values including decimal parts having slightly larger digit counts than the keyTimes attribute like "198.784" and "59.762". In such case, when these real number values undergo integer encoding, their encoded values have larger sizes than in the IEEE754 format, and such values are often preferably encoded in the IEEE754 format. Hence, this embodiment will explain a case in which the IEEE754 format and integer encoding are selectively used depending on a value to be encoded.

Since the flowchart of an encoding process according to this embodiment is basically the same as that shown in FIG. 4, the encoding process according to this embodiment will be explained below using FIG. 4.

Prior to execution of processing according to the flowchart of FIG. 4, a part to be encoded is designated in advance in the data of the SVG document. If all real number values are to be encoded, no designation is especially required.

In this embodiment, assume that a d attribute of a path element is designated as an object to be encoded in the data of the SVG document shown in FIG. 2. Also, delimiters "M", "c", and "," of real number values enumerated as attribute values are designated.

The CPU 101 loads the data of the SVG document shown in FIG. 2 from the external storage device 104 onto the RAM 103. Note that the method of acquiring the data of the SVG document shown in FIG. 2 onto the RAM 103 is not particularly limited.

The CPU 101 then starts the processing according to the flowchart of FIG. 4.

The CPU 101 sequentially refers to data of the SVG document input as an object to be encoded to the RAM 103, and it checks in step S401 if the referred part is the d attribute of the path element. As a result of checking, if the referred part is not the d attribute of the path element, the process advances to step S402. In step S402, the CPU 101 encodes the referred part by binary XML as is conventionally done.

On the other hand, as a result of checking in step S401, if the referred part is the d attribute of the path element, the process advances to step S403.

The CPU 101 checks in step S403 if all value character strings (attribute values) in the d attribute of the path element are extracted. As a result of checking, if all value character strings are extracted, the process advances to step S405; otherwise, the process advances to step S404.

In step S404, the CPU 101 extracts a value character string (attribute value) which is not extracted yet in the d attribute of the path element. The CPU 101 uses the delimiters "M", "c", and ",", which are designated in advance, to extract the value character strings. In this embodiment, value character strings to be extracted are 198.784, 59.762, 3.183, −0.911, 4.972, −2.825, 5.366, and −5.742. As in the first embodiment, the value character strings may be detected without particularly using the designated delimiters.

Then, the CPU 101 acquires a digit count c' after the decimal point of each extracted value character string.

That is, when the process advances from step S403 to step S405, this means that the CPU 101 has acquired the digit counts c' after the decimal point for all value character strings (attribute values) in the d attribute of the path element.

In step S405, the CPU 101 calculates a maximum value (maximum digit count) C of the digit counts c' acquired in step S404 in association with all the value character strings (attribute values) in the d attribute of the path element.

In step S405, the CPU 101 determines the value of C. This embodiment determines the value of C as follows unlike in the first embodiment.

In a rendering process like SVG, required value precision can be determined in advance. Hence, this embodiment determines, as the value of C, a digit count=3 after the decimal point as the value precision designated in advance.

Before determination of the encoding method, the CPU 101 checks if integer encoding is to be applied. To attain this checking process, a threshold is set in advance.

Integer encoding has no significance if it results in a larger size than that encoded by IEEE754. Upon encoding by IEEE754, at least 4 bytes are required. An encoded size can be reduced if it is smaller than 4 bytes. This embodiment applies integer encoding to a case in which a value can be encoded to an integer of 2 bytes or less at which a sufficient size reduction effect can be obtained. A threshold may be determined using a bit unit in place of a byte unit. However, since a shift process is required upon parsing, this embodiment uses a byte unit.

A 2-byte integer can express values ranging from −32768 to 32767 if the complement notation of 2 is used. Upon transforming a real number into an integer, if that integer falls within the range from −32768 to 32767, it is determined that integer encoding should be applied. In other words, this value range is determined based on a size which is set in advance as a data size of the encoded result.

Figure 7:
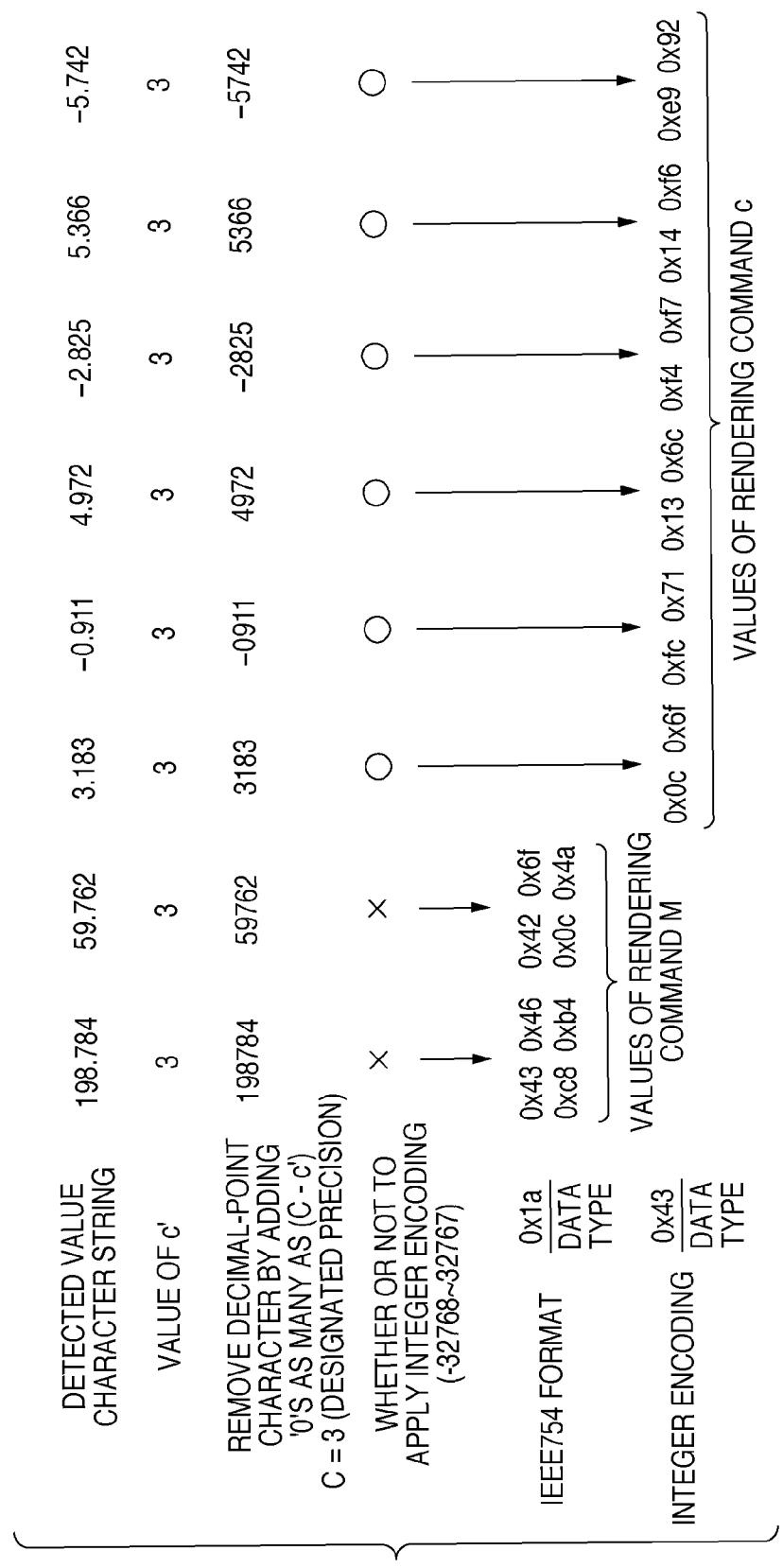
FIG. 7 is a view for explaining transformation results.

In step S406, the CPU 101 generates a value character string that represents an integer value obtained by multiplying the value character string by $10^C$ as in the first embodiment. By applying the process in step S406 to all value character strings, the following transformation results are obtained, as shown in FIG. 7. That is, value character strings can be obtained like "198.784"→"198784", "59.762"→"59762", "3.183"→"3183", "−0.911"→"−0911", "4.972"→"4972", "−2.825"→"−2825", "5.366"→"5366", and "−5.742"→"−5742".

Next, the CPU 101 checks if values represented by the value character strings obtained by the above transformation fall within the value range from −32768 to 32767. Such checking process can be attained by comparing value character strings or their lengths.

A value character string which falls within the range is encoded as binary XML intact as in the first embodiment. As for a value character string which falls outside the range, a value character string before transformation (transformation source) in step S406 is encoded as binary XML in the IEEE754 format. In this embodiment, as shown in FIG. 7, it is determined that coordinate information values 198.784 and 59.762 of a rendering command M are to undergo encoding in the IEEE754 format, and the remaining real number values are to undergo integer encoding.

This determination process does not always use the aforementioned method, and may be implemented using information described in the SVG document. In the description of the d attribute of the path element of the SVG document, rendering commands and pieces of value information required for the processing are enumerated. At this time, it is specified that if a rendering command is designated by a capital letter such as M, C, or the like, absolute value expression is used, and if a rendering command is designated by a small letter such as c or the like, relative value expression is used. As shown in FIG. 2, the absolute value expression tends to designate values with larger digit counts than the relative value expression. Hence, identification characters that represent the absolute value expression and relative value expression are designated in advance, and it is determined for the absolute value expression that a value is encoded in the IEEE754 format, and for the relative value expression that integer encoding is done.

However, this determination process is not strict, and some determination errors may occur. Even when a determination error has occurred, the encoding method according to this embodiment is not partially optimally applied, and sufficient effects can be obtained without posing any problem in terms of processing.

In this embodiment, the same results can be obtained if determination is made using either method.

Finally, the CPU 101 encodes the value character strings generated in step S406 for all the value character strings, value character strings before transformation, and the maximum digit count C in step S407. In this embodiment, these values are encoded as binary XML. Encoded values are described as a part of another data.

Upon encoding as binary XML using the data type definitions shown in FIG. 6, the results shown in FIG. 7 are obtained. The data type of decimal values of the rendering command M is 0x1a, and that of other decimal values is 0x43 since they are 2-byte integers, and use $10^3$. The decimal values are respectively encoded like 198.784→0x4346c8b4, 59.762→0x426f0c4a, 3.183→0x0c6f, −0.911→0xfc71, 4.972→0x136c, −2.825→0xf4f7, 5.366→0x14f6, and −5.742→0xe992.

On the decoding side, inverse transformation is executed according to the data types of encoded data to acquire original real number values, as in the first embodiment.

Third Embodiment

This embodiment will explain a case in which the encoding method described in the first embodiment is applied to a values attribute of the SVG document shown in FIG. 2. The values attribute also describes many values. These values are enumeration of changes in certain value upon animation, and are used together with the keyTimes attribute. It is specified that the values of the values attribute are described using the absolute value expression. The values (−418, −446.71, etc.) include those which exceed 2 bytes if they undergo integer unlike in the first and second embodiments. Hence, this embodiment will explain encoding for these values described using the absolute value expression.

The encoding processing according to this embodiment will be described below.

A part to be encoded is designated in advance in the data of the SVG document. If all values are to be encoded, no designation is especially required.

In this embodiment, assume that the values attribute of the animateTransform element in the data of the SVG document shown in FIG. 2 is designated as an object to be encoded. Also, delimiters "," and ";" of real number values enumerated as attribute values are designated.

The CPU 101 loads the data of the SVG document shown in FIG. 2 from the external storage device 104 onto the RAM 103. Note that the method of acquiring the data of the SVG document shown in FIG. 2 onto the RAM 103 is not particularly limited.

The CPU 101 sequentially refers to the data of the SVG document input as an object to be encoded to the RAM 103, and it checks if the referred part is the values attribute of the animateTransform element. As a result of checking, if the referred part is not the values attribute of the animateTransform element, the CPU 101 encodes the referred part by binary XML as is conventionally done.

On the other hand, if the referred part is the values attribute of the animateTransform element, the CPU 101 checks if all value character strings (attribute values) in the values attribute of the animateTransform element are extracted. As a result of checking, if all value character strings are not extracted, the CPU 101 extracts a value character string (attribute value) which is not extracted yet in the values attribute of the animateTransform element. The CPU 101 uses delimiters "," and ";", which are designated in advance, to extract the value character strings. In this embodiment, value character strings to be extracted are −68, −418, −101,49, −446,71, −126.52, −465.24, −139.49, −469.29, −139.8, and −458.14. As in the first embodiment, value character strings can be detected without particularly using the designated delimiters.

The CPU 101 calculates difference values of value character strings between sets (difference values between attribute values) from the head in the sort order of sets of value character strings delimited by the delimiters. As a result, (−33.49, −28.71), (−25.03, −18.53), (−12.97, −4.05), and (−0.31, 11.15) are calculated.

In the subsequent processes, these difference values are to undergo integer encoding. Note that the first set (−68, −418) in the sort order of the sets includes absolute values, and these values are to undergo encoding in the IEEE754 format.

Then, the CPU 101 acquires digit counts c' after the decimal point of the respective difference values.

The CPU 101 calculates a maximum value (maximum digit count) C of the digit counts c' acquired for the respective difference values. Then, the CPU 101 generates value character strings that represent integer values obtained by multiplying the difference values by $10^C$. Finally, in step S407 the CPU 101 encodes the first set, respective difference values, and maximum digit count C. In this embodiment as well, the values are encoded as binary XML.

Figure 8:
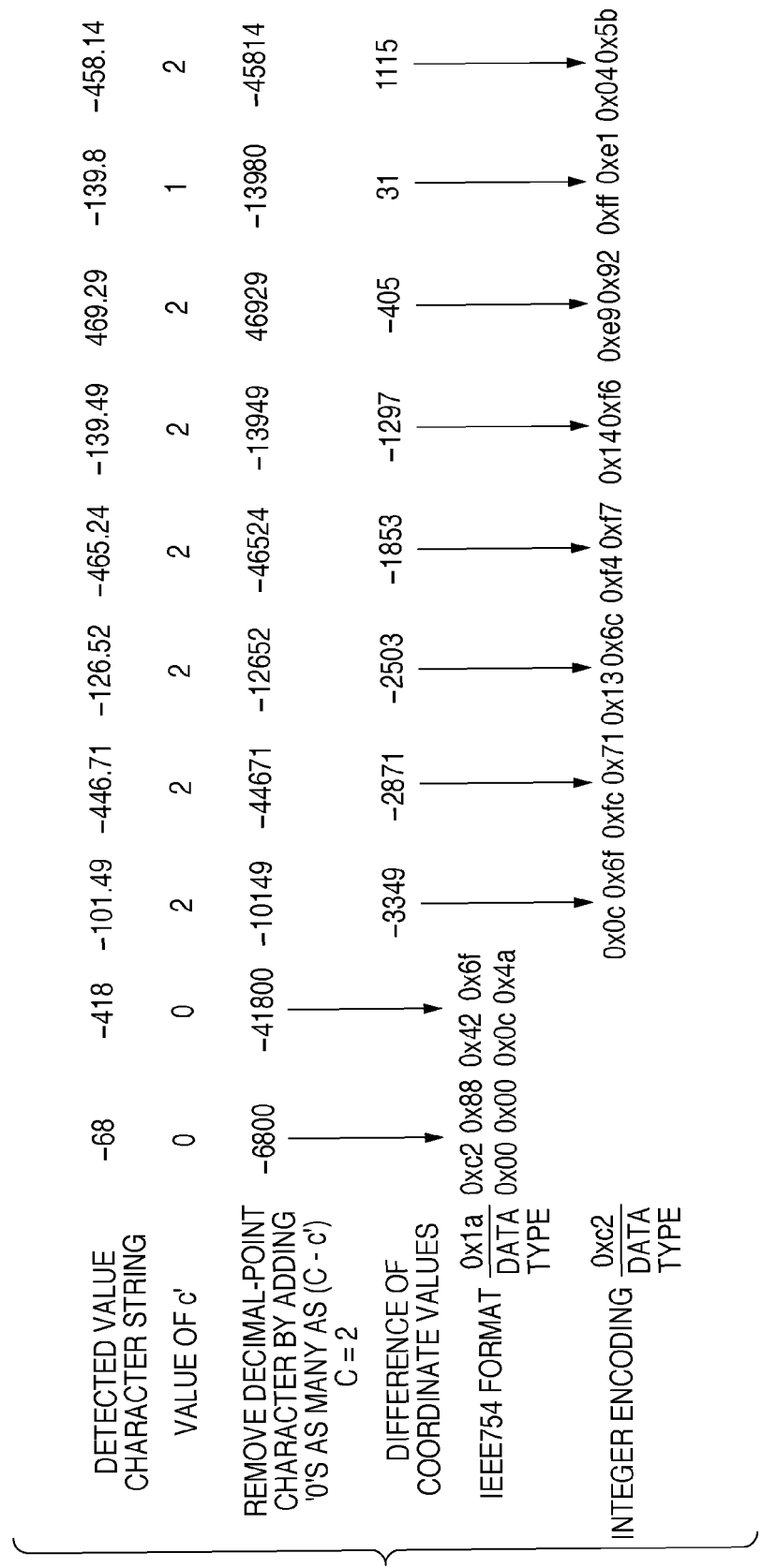
FIG. 8 is a view for explaining transformation results.
Figure 10:
FIG. 10 is a view for explaining expansion results of definitions of data types shown in FIG. 6.

FIG. 10 is a view for explaining expansion results of definitions of data types shown in FIG. 6. More specifically, it is to perform integer encoding by calculating differences, and it is expressed by setting the start first bit to be "1". In this embodiment, as shown in FIG. 8, the data type of the first coordinates is 0x1a, and that of the remaining coordinates is 0xc2 since they are 2-byte integers and use $10^2$. Decimal values are respectively encoded to 0xc2880000, 0xc3d1000, x0f2eb, 0xf4c9, 0xf639, 0xf8c3, 0xfaef, 0xfe6b, 0xffe1, and 0x045b.

With the above processing, the data size of even a decimal described as an absolute value can be reduced.

On the decoding side, inverse transformation is executed according to the data types of encoded data to acquire original decimal values, as in the first embodiment.

Fourth Embodiment

In this embodiment, each XML data to be encoded is transformed in advance into a data format that allows easy integer encoding.

The SVG specification specifies a transform attribute. The transform attribute is used to transform a coordinate system of a described coordinate value, and can describe a transformation process before a rendering process.

FIG. 9 shows examples of attribute values of a d attribute of a path element in an SVG document. As shown in FIG. 9, the d attribute of the path element describes data of a plurality of real number values.

In the encoding processing according to this embodiment, the processes in steps S401 to S405 in the flowchart of FIG. 4 are executed in the same manner as in the first embodiment.

Since real number values described in the d attribute in FIG. 9 have a maximum digit count=3 after the decimal point, "3" is settled as C in step S405. Upon encoding respective real number values, integer values obtained by multiplying these real number values by $10^3$ are encoded in place of encoding in the IEEE754 format.

In order to restore each value, the value needs to be multiplied by 0.001. Hence, a description of the transform attribute is added to the data of the SVG document to allow a normal rendering process. "scale(X)" is a description of a transformation process which multiplies a coordinate value by X. Since each value is multiplied by 0.001, "transform=scale (0.001)" is described. As for an element as a description destination, a container element g shown in example 1 in FIG. 9 or a graphic element path shown in example 2 may be used.

The added transform attribute is encoded by a normal binary XML encoding method.

With the above processing, when designation of a value transformation process is supported by the specification on the application data side like SVG data, the method of this proposal can be applied independently of the format of binary encoding by editing data in advance.

Note that the aforementioned embodiments may be combined as needed, and the processes in the respective embodiments may be executed parallelly or may be selectively executed as needed according to various conditions.

Other Embodiments

Note that the present invention can take embodiments in the forms of, for example, a system, apparatus, method, program, computer-readable storage medium, and the like. More specifically, the present invention can be applied to either a system constituted by a plurality of devices, or an apparatus consisting of a single equipment.

Note that the present invention can also be achieved in the following mode. That is, a program of software that implements the functions of the aforementioned embodiments (a program corresponding to the aforementioned flowchart) is directly or remotely supplied to a system or apparatus. Then, a computer of the system or apparatus reads out and executes the supplied program code, thus achieving the present invention.

Therefore, the program code itself installed in a computer to implement the functional processing of the present invention using the computer also implements the present invention. That is, the present invention also includes the computer program itself for implementing the functional processing of the present invention.

In this case, the form of program is not particularly limited, and an object code, a program to be executed by an interpreter, script data to be supplied to an OS, and the like may be used as long as they have the program function.

As a recording medium for supplying the program, for example, the following media may be used: a Floppy® disk, hard disk, optical disk, magneto-optical disk, MO, CD-ROM, CD-R, CD-RW, magnetic tape, nonvolatile memory card, ROM, DVD (DVD-ROM, DVD-R), and the like.

As another program supply method, the following method may be used. The user establishes a connection to a homepage on the Internet using a browser of a client computer, and downloads the computer program itself of the present invention or a compressed file including an automatic installation function from the homepage to a recording medium such as a hard disk or the like. Also, program codes that form the program of the present invention may be segmented into a plurality of files, which may be downloaded from different homepages. That is, the present invention also includes a WWW server which makes a plurality of users download a program file required to implement the functional processing of the present invention by their computers.

A storage medium such as a CD-ROM or the like, which stores the encrypted program of the present invention, may be delivered to users, and each user who has cleared a predetermined condition is allowed to download key information required for decryption from a homepage via the Internet. The user executes the encrypted program using that key information to install the program on a computer, thus implementing the present invention.

The functions of the aforementioned embodiments can be implemented when the computer executes the readout program. That is, the functions of the aforementioned embodiments are implemented by executing such program. In addition, an OS or the like running on the computer executes some or all of actual processes based on an instruction of that program, thereby implementing the functions of the aforementioned embodiments.

Furthermore, the functions of the aforementioned embodiments can be implemented by the following processing. That is, the program read out from the recording medium is written in a memory equipped on a function expansion board or function expansion unit which is inserted in or connected to the computer. After that, a CPU or the like equipped on the function expansion board or unit executes some or all of actual processes based on an instruction of that program, thereby implementing the functions of the aforementioned embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2007-244449 filed Sep. 20, 2007, and 2008-226380 filed Sep. 3, 2008, which are hereby incorporated by references herein in their entirety.

What is claimed is:

1. A document encoding apparatus for encoding a structured document, comprising:
    a detection unit configured to detect attribute values in the structured document;
    an acquisition unit configured to acquire digit counts after a decimal point of the attribute values detected by said detection unit;
    a transformation unit configured to transform the attribute values detected by said detection unit into value character strings that represent integer values by manipulating decimal point positions of the attribute values in accordance with a maximum digit count of the digit counts acquired by said acquisition unit;
    a determination unit configured to determine whether or not each of the integer values represented by the value character strings falls within an integer range in which a k-byte integer expresses values, wherein the number of bytes of an encoding result obtained by encoding a value in a predetermined format is more than the k-byte integer;
    a first encoding unit configured to encode, according to an integer encoding method, the value character strings which represent the values falling within the integer range and the maximum digit count; and
    a second encoding unit configured to encode, in the predetermined format, the attribute values as a transformation source of the value character strings which represent the values falling outside the integer range.

2. The apparatus according to claim 1, wherein letting C be the maximum digit count, said transformation unit generates the value character strings that represent the integer values obtained by multiplying the attribute values by 10C.

3. The apparatus according to claim 1, wherein said first encoding unit encodes by binary XML.

4. The apparatus according to claim 1, wherein the structured document is an SVG document.

5. A document encoding method executed by a document encoding apparatus for encoding a structured document, comprising:
    a detection step of detecting attribute values in the structured document;
    an acquisition step of acquiring digit counts after a decimal point of the attribute values detected in the detection step;
    a transformation step of transforming the attribute values detected in the detection step into value character strings that represent integer values by manipulating decimal point positions of the attribute values in accordance with a maximum digit count of the digit counts acquired in the acquisition step;
    a determination step of determining whether or not each of the values represented by the value character strings falls within an integer range in which a k-byte integer expresses values, wherein the number of bytes of an encoding result obtained by encoding a value in a predetermined format is more than the k-byte integer;
    a first encoding step of encoding, according to an integer encoding method, the value character strings which represent the values falling within the integer range and the maximum digit count; and
    a second encoding step of encoding, in the predetermined format, the attribute values as a transformation source of the value character strings which represent the values falling outside the integer range.

6. A non-transitory computer-readable storage medium storing a program that makes a computer execute a document encoding method according to claim 5.

* * * * *